United States Patent
Essert et al.

(10) Patent No.: US 10,092,974 B2
(45) Date of Patent: Oct. 9, 2018

(54) METHOD FOR PRODUCING A CIRCUIT CARRIER AND FOR CONNECTING AN ELECTRICAL CONDUCTOR TO A METALLIZATION LAYER OF A CIRCUIT CARRIER

(71) Applicant: Infineon Technologies AG, Neubiberg (DE)

(72) Inventors: Mark Essert, Moehnesee (DE); Marianna Nomann, Ruethen (DE); Thomas Nuebel, Warstein (DE); Guido Strotmann, Anroechte (DE)

(73) Assignee: Infineon Technologies AG, Neubiberg (DE)

( * ) Notice: Subject to any disclaimer, the term of this patent is extended or adjusted under 35 U.S.C. 154(b) by 351 days.

(21) Appl. No.: 14/751,361

(22) Filed: Jun. 26, 2015

(65) Prior Publication Data

US 2016/0001393 A1    Jan. 7, 2016

(30) Foreign Application Priority Data

Jul. 1, 2014 (DE) .......... 10 2014 109 183

(51) Int. Cl.
| | |
|---|---|
| B23K 20/00 | (2006.01) |
| B23K 20/10 | (2006.01) |
| B23K 20/22 | (2006.01) |
| H05K 3/32 | (2006.01) |
| B23K 101/38 | (2006.01) |
| H05K 1/02 | (2006.01) |
| H05K 1/03 | (2006.01) |

(52) U.S. Cl.
CPC ............. *B23K 20/10* (2013.01); *B23K 20/22* (2013.01); *H05K 3/328* (2013.01); *B23K 2201/38* (2013.01); *H05K 1/0263* (2013.01); *H05K 1/0306* (2013.01); *H05K 2203/0285* (2013.01)

(58) Field of Classification Search
CPC . H01L 21/4857; H01L 21/6835; H01L 24/73; H01L 25/0657; H01L 27/016; B23K 20/16
USPC .......................................... 228/180.1; 29/843
See application file for complete search history.

(56) References Cited

U.S. PATENT DOCUMENTS

| | | | |
|---|---|---|---|
| 5,060,051 A | 10/1991 | Usuda et al. | |
| 2012/0000695 A1* | 1/2012 | Chisaka | H05K 1/0271 174/251 |

FOREIGN PATENT DOCUMENTS

| | | |
|---|---|---|
| CN | 102194767 A | 9/2011 |
| CN | 102969306 A | 3/2013 |
| JP | 2011181845 A * | 9/2011 |

OTHER PUBLICATIONS

Computer english translation JP-2011181845-A (Year: 2011).*

* cited by examiner

*Primary Examiner* — Erin B Saad
(74) *Attorney, Agent, or Firm* — Murphy, Bilak & Homiller, PLLC

(57) ABSTRACT

One aspect of the invention relates to a method for producing a circuit carrier. For this purpose, an electrically insulating carrier is provided, having an upper side and also an underside opposite from the upper side. A first metal foil and a hardening material are likewise provided. Then, an upper metallization layer, which is arranged on the upper side and has a hardening area, is produced. In this case, at least one contiguous portion of the hardening area is created by at least part of the hardening material being diffused into the first metal foil.

12 Claims, 5 Drawing Sheets

METHOD FOR PRODUCING A CIRCUIT CARRIER AND FOR CONNECTING AN ELECTRICAL CONDUCTOR TO A METALLIZATION LAYER OF A CIRCUIT CARRIER

PRIORITY CLAIM

This application claims priority to German Patent Application No. 10 2014 109 183.3 filed on 1 Jul. 2014, the content of said application incorporated herein by reference in its entirety.

BACKGROUND

For producing power semiconductor modules, substrates which have an electrically insulating layer, for example of ceramic, that is provided with a metallization layer are often used as circuit carriers. The metallization layer serves for the mounting and interconnection of electrical components. In order to connect electrical leads or other conductors in an electrically conducting manner to the metallization layer, ultrasonic welding methods are often used. This involves the conductor being pressed against the metallization layer by a sonotrode and set in vibration in relation to the metallization layer by means of ultrasound. The relative movement of the two parts to be welded in combination with a pressing force that is acting leads to the formation of an electrically conducting connection that is very secure and stable under changing temperatures.

However, on account of the high pressing force required, there is the risk of the insulating layer being damaged and loosing its insulating resistance. This problem increases as the cross section of the conductor to be welded on increases, because larger cross sections of the conductor require higher pressing forces. Since the insulating layer must not be damaged, the process parameters in the ultrasonic welding must often be chosen outside the range of parameters that is desirable for an optimum ultrasonic welding result.

SUMMARY

The object of the present invention is to provide a method for producing a circuit carrier which has a metallization layer and an electrically insulating layer and to the metallization layer of which a conductor with a large conductor cross section can also be connected by ultrasonic welding without damaging the electrically insulating layer. A further object of the invention is to provide a method by which a conductor with a large conductor cross section can also be connected by ultrasonic welding to a metallization layer of a circuit carrier without thereby damaging an electrically insulating layer of the circuit carrier.

According to an embodiment, a method for producing a circuit carrier includes providing an electrically insulating carrier, which has an upper side and also an underside opposite from the upper side, providing a first metal foil, providing a hardening material, and producing an upper metallization layer arranged on the upper side and having a hardening area. At least one contiguous portion of the hardening area is created by at least part of the hardening material being diffused into the first metal foil.

According to an embodiment, a method for connecting an electrical conductor to a metallization layer of a circuit carrier includes providing a circuit carrier which has an electrically insulating carrier with an upper side and an underside opposite from the upper side, and also an upper metallization layer, which is arranged on the upper side and has a hardening area with a first hardness, and also an area that is different from the hardening area and has a second hardness, which is less than the first hardness. The hardening area has a contiguous portion. The method further includes establishing a connecting location on the side of the upper metallization layer that is facing away from the electrically insulating carrier. The position of the connecting location is chosen such that the hardening area is arranged between the connecting location and the electrically insulating carrier. The method further includes establishing an electrically conducting, material-bonding connection between the upper metallization layer and the conductor at the connecting location by ultrasonic welding.

BRIEF DESCRIPTION OF THE DRAWINGS

The invention is explained below on the basis of exemplary embodiments with reference to the accompanying figures, in which.

Unless otherwise specified, in the figures the same designations denote elements that are the same or have the same effect.

DETAILED DESCRIPTION

For the purposes of the present description, unless otherwise specified, indications of the hardness of a material relate to measurement in accordance with DIN EN ISO 14577 ("Metallic materials—Instrumented indentation test for determining hardness and other material parameters"), the content of which is incorporated by reference in its entirety, to be precise in conjunction with the testing parameter "Force-controlled tests up to a maximum force of 9 mN" when using a nanoindenter with a Berkovich tip and a testing time of 20 seconds.

Figure 1A:
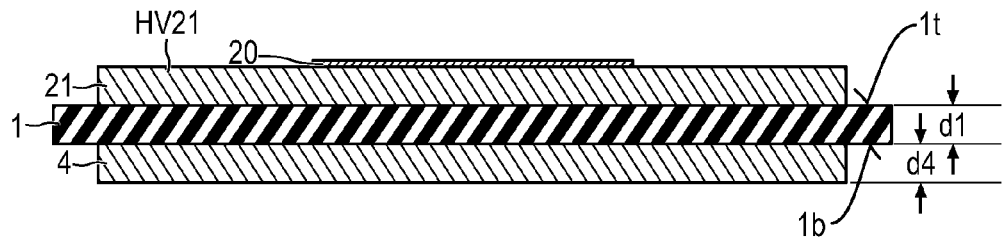
FIGS. 1A to 1C show various steps of a method for producing a circuit carrier.

FIG. 1A shows an arrangement with an electrically insulating carrier 1. The carrier 1 has an upper side 1*t* and an underside 1*b*, opposite from the upper side 1*t*, and has a thickness d1. The thickness d1 may in principle be chosen as desired; for example, it may be at least 0.2 mm and/or at most 2 mm. Optionally, the carrier 1 may be formed as a planar, thin layer, but it may in principle be formed as desired.

The carrier 1 may for example be formed as ceramic. It may for example comprise one or a combination of the following ceramic materials or consist of one or a combination of the following ceramic materials: aluminum oxide ($Al_2O_3$); aluminum nitride (AlN); beryllium oxide (BeO); zirconium oxide ($ZrO_2$); yttrium oxide ($Y_2O_3$); calcium oxide (CaO); magnesium oxide (MgO); boron carbide ($B_4C$); silicon nitride ($Si_3N_4$); boron nitride (BN); diamond; other carbon modifications as diamond.

Optionally, the carrier 1 may consist entirely of ceramic, glasses not being regarded as ceramics for the purposes of the present invention. The carrier 1 may have a ceramic content of at least 90% by weight (percent by weight).

On the upper side 1t, a first metal foil 21 has been applied and connected in a material-bonding manner to the carrier 1. In this case, the first metal foil 21 may, as represented, directly adjoin the upper side 1t. However, there may also be one or more metallic or nonmetallic intermediate layers between the carrier 1 and the first metal foil 21.

As in the case of all configurations, on the underside 1b, a lower metallization layer 4 may optionally be applied and connected in a material-bonding manner to the carrier 1. The lower metallization layer 4 may, as represented, directly adjoin the underside 1b. However, there may also be one or more metallic or nonmetallic intermediate layers between the carrier 1 and the lower metallization layer 4.

The first metal foil 21 has a hardness H21. In order to increase the hardness H21 of the first metal foil 21, at least locally, a hardening material 20 is applied to its side facing away from the carrier 1 and completely or at least partially diffused into the first metal foil 21 during a conditioning step, in which the first metal foil 21 and the hardening material 20 are heated to temperatures of at least 350° C. The temperatures are in this case chosen to be lower than the melting point of the first metal foil 21. The hardening material 20 has been made to match the material of the first metal foil 21 so as to cause in the first metal foil 21, at least locally, as shown in the result in FIG. 1B, the forming of a hardening area 25, which has a hardness H25, which is higher than the original hardness H21 of the first metal foil 21. The creation of the hardening area 25 is based on a precipitation hardening brought about by the diffusion of the hardening material 20. Optionally, the hardness H25 may be greater than the original hardness H21 by at least 10%.

For a metal foil to be hardened, for example the first metal foil 21, that consists of copper, one or more of the following substances is/are suitable for example as hardening material 20: beryllium (Be), silver (Ag), manganese (Mn), iron (Fe), phosphorus (P), zinc (Zn), nickel (Ni), tin (Sn), aluminum (Al), zirconium (Zr), chromium (Cr).

Furthermore, for a metal foil to be hardened, for example the first metal foil 21, that consists of aluminum, one or more of the following substances is/are suitable for example as hardening material 20: copper (Cu), zinc (Zn), magnesium (Mg), silicon (Si), manganese (Mn).

The hardening area 25 leads in any event to an increase in the mechanical stability of the first metal foil 21, whereby a portion 11 of the carrier 1 that is located underneath the hardening area 25 is mechanically protected. If then an electrical conductor above the hardening area 25 is welded to the first metal foil 21 by ultrasonic welding, the process parameters used for the ultrasonic welding (for example the pressing force with which a sonotrode presses the electrical conductor against the upper metallization layer 2) may be chosen such that the ultrasonic welding result achieved (that is to say the strength of the welded connection) is better than in the case of a conventional arrangement that is identical apart from the absent hardening area 25.

A circuit carrier 10 produced in this way may already be used for the mounting of one or more active and/or passive electronic components. Directly after the production of the upper metallization layer 2, having the hardness area 25, the circuit carrier 10 may be completely unpopulated, in particular it may not be populated with active and/or passive electronic components, and is only populated with such components after that.

Optionally, before it is populated (FIGS. 1B and 10), the upper metallization layer 2 may be structured to form conductor tracks and/or mounting areas 51, 52, 53, 54, which is shown by way of example in FIG. 10. The structuring may be performed in any way desired, for example by etching or milling or laser machining.

As likewise revealed by FIG. 10, a hardening area 25 may have one or more contiguous portions 250.

Figure 2:
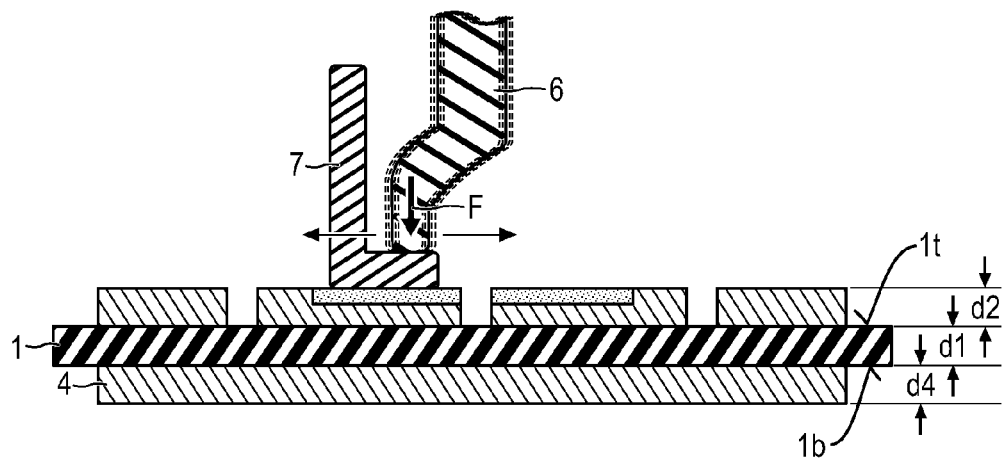
FIG. 2 shows the establishing of an electrically conducting connection between an electrical conductor and the upper metallization layer of the circuit carrier according to FIG. 1C by ultrasonic welding.

As represented in FIG. 2 by the example of the circuit carrier 10 according to FIG. 10, an electrical conductor 7 may be welded onto an upper metallization layer 2, which has a hardening area 25, by ultrasonic welding. For this purpose, a connecting location 28 (FIG. 10) is established on the side of the upper metallization layer 2 that is facing away from the carrier 1. The position of the connecting location 28 is chosen such that the hardening area 25 is arranged between the connecting location 28 and the carrier 1. Then an electrically conducting, material-bonding connection between the upper metallization layer 2 and the conductor 7 is established at the connecting location 28 by ultrasonic welding.

For this purpose, the conductor 7 is pressed with a pressing force F against the side of the upper metallization layer 2 that is facing away from the carrier 1 by a sonotrode 6. The conductor 7 in this case lies directly against the upper metallization layer 2. During the acting of the pressing force F on the conductor 7, the sonotrode 6 is set in vibration in the ultrasonic range (≥15 kHz). The vibration may in this case take the form of linear vibration—as indicated in FIG. 2 by horizontal lines—, in the case of which the sonotrode 6 oscillates back and forth substantially parallel to the upper side 1t. Alternatively, vibration could also take place as rotational vibration about an axis that extends perpendicularly in relation to the upper side 1t through the connecting location 28.

Figure 1B:
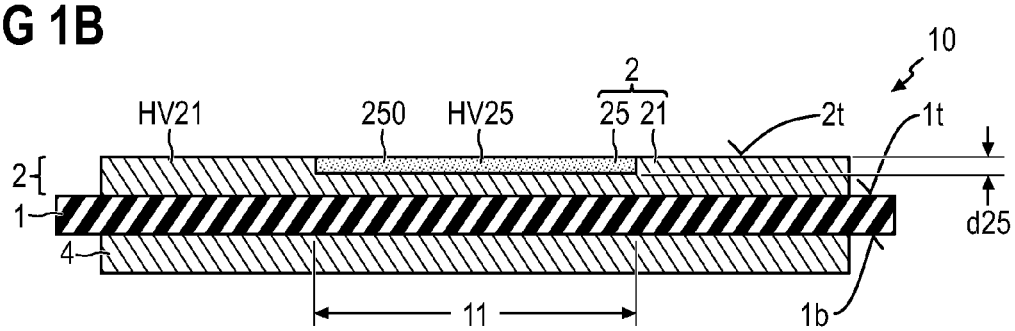
Figure 1C:
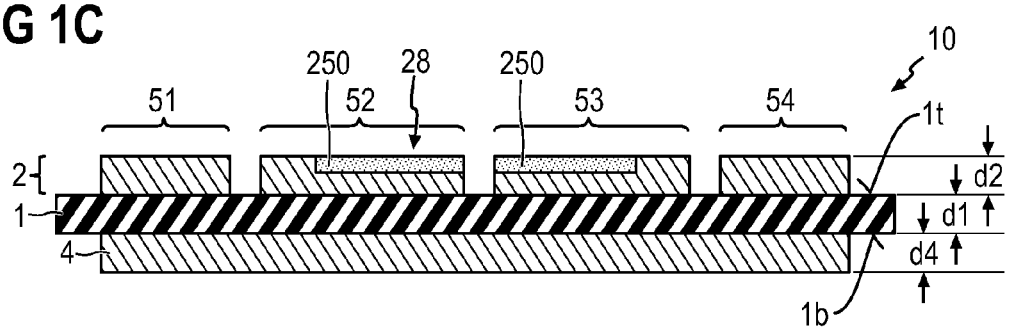

In the case of the exemplary embodiment according to FIGS. 1B and 1C, the hardening area 25 extends up to the side of the first metal foil 21 that is facing away from the carrier 1, where it is freely accessible, and is consequently located at the surface of the circuit carrier 10. Optionally, however, one or more further metal layers could be applied to a circuit carrier 10, whether before the structuring of the upper metallization layer 2 (FIG. 1B) or thereafter (FIG. 1C), onto the hardening area 25 in such a way that the hardening area 25 is located between the carrier 1 and each one of these further metal layers. In this case, the one or more further metal layers would be a component part of the upper metallization layer 2. The connecting location 28 would then be located on the side of the one further metal layer or of the uppermost of the more than one further metal layers that is facing away from the carrier 1. After the ultrasonic welding of an electrical conductor 7 to the upper metallization layer 2 at the connecting location 28, the one or more metal layers would be respectively arranged between the electrical conductor 7 and the hardening area 25.

The creation of the hardening area 25 (as from applying the hardening material 20 to the first metal foil 21) may be performed, as explained, in a state in which the first metal foil 21 has already been connected in a material-bonding manner to the upper side 1t of the carrier 1. Alternatively, however, there is also the possibility of first creating the hardening area 25 in the first metal foil 21 and only then connecting the first metal foil 21 together with the hardening area 25 in a material-bonding manner to the upper side 1t of the carrier 1.

Figure 3A:
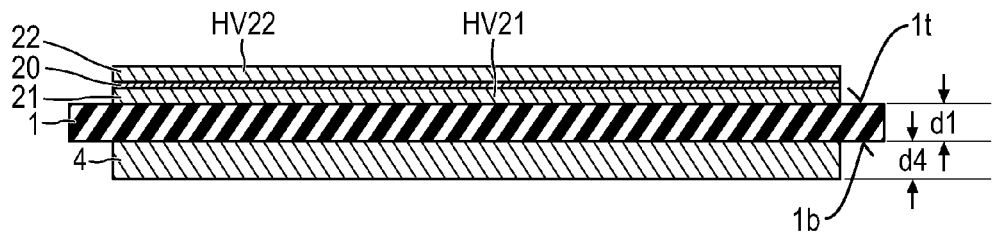
FIGS. 3A to 3C show various steps of a further method for producing a circuit carrier.

A further example of producing a circuit carrier 10 with an upper metallization layer 2 having a hardening area 25 is explained below with reference to FIGS. 3A to 3C. Here, as shown in FIG. 3A, the hardening material 20 is introduced between the first metal foil 21 and a second metal foil 22. After that, part of the hardening material 20 is diffused into the first metal foil 21 and a further part into the second metal foil 22 during a conditioning step, in which the first metal foil 21, the second metal foil 22 and the hardening material 20 are heated to temperatures of at least 350° C.

Figure 3B:
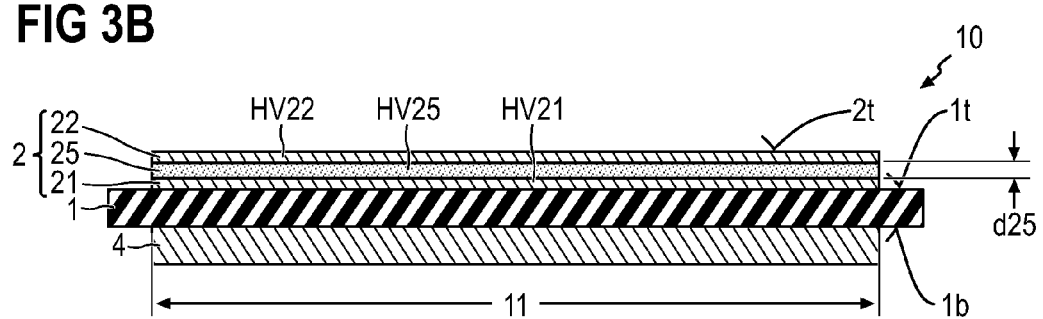

FIG. 3B shows the circuit carrier 10 after the production of the hardening area 25. If—as shown in the result in FIG. 3B—the hardening material 20 has been diffused completely into the first metal foil 21 and the second metal foil 22, a contiguous hardening area 25 is created. If, on the other hand, part of the hardening material 20 remains between the first metal foil 21 and the second metal foil 22 after the conditioning step, two hardening areas that are separate from one another would be created: a first in the first metal foil 21 and a second in the second metal foil 22. In both cases, the hardening material 20 has been made to match the material or the materials of the first metal foil 21 and of the second metal foil 22 in such a way that the hardening area 25 has a hardness H25, which is higher than the original hardness H21 of the first metal foil 21 and/or higher than the original hardness H22 of the second metal foil 22. Alternatively or in addition, the hardening area 25 may also have a reduced modulus of elasticity $E_r25$, which is higher than the original reduced modulus of elasticity $E_r21$ of the first metal foil 21 and/or higher than the original hardness H22 of the second metal foil 22.

Optionally, the hardness H25 may be greater by at least 10% than the hardness H21 and/or greater by at least 10% than the hardness H22. Likewise optionally, the reduced modulus of elasticity $E_r25$ may be higher by at least 10% than the original reduced modulus of elasticity $E_r21$ and/or higher by at least 10% than the original reduced modulus of elasticity $E_r22$ of the second metal foil 22.

A circuit carrier 10 as described with reference to FIGS. 3A and 3B may already be used for the mounting of one or more electronic components. Optionally, before it is populated (FIGS. 3B and 3C), the upper metallization layer 2 may be structured to form conductor tracks and/or mounting areas 51, 52, 53, 54, which is shown by way of example in FIG. 3C. The structuring may be performed in any way desired, for example by etching or milling or laser machining.

Figure 3C:
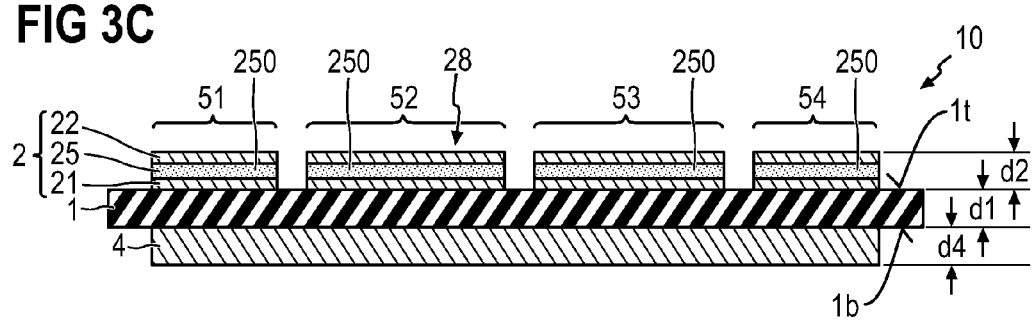
Figure 4:
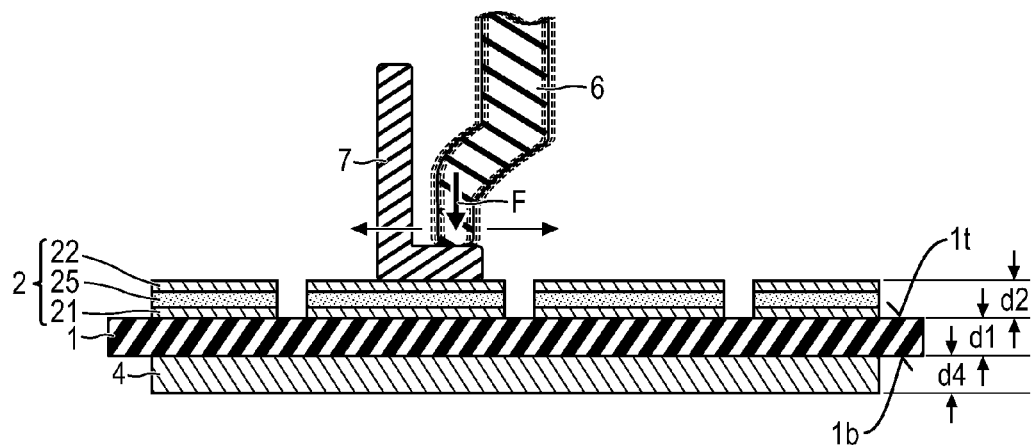
FIG. 4 shows the establishing of an electrically conducting connection between an electrical conductor and the upper metallization layer of the circuit carrier according to FIG. 3C by ultrasonic welding.

As represented in FIG. 4 by the example of the circuit carrier 10 according to FIG. 3C, an electrical conductor 7 may be welded onto the upper metallization layer 2, which has a hardening area 25, by ultrasonic welding. For this purpose, a connecting location 28 is established on the side of the upper metallization layer 2 that is facing away from the carrier 1 (FIG. 3C). The position of the connecting location 28 is in turn chosen such that—as in the case of all the variants of the invention—the hardening area 25 is arranged between the connecting location 28 and the carrier 1. The welding on of the conductor 7 at the connecting location 28 is performed in the way already explained with reference to FIG. 2.

Figure 5A:
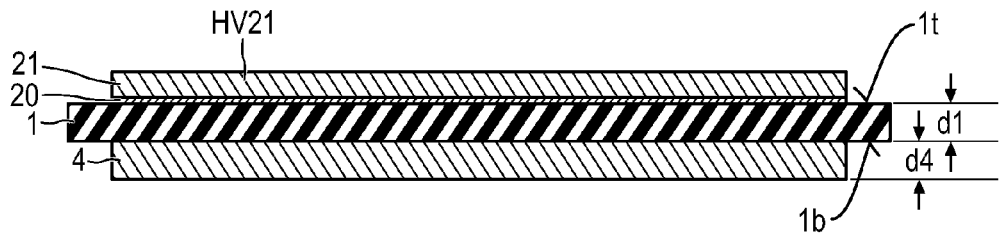
FIGS. 5A to 5C show various steps of a method for producing a circuit carrier.

Yet another example of the production of a circuit carrier 10 with an upper metallization layer 2 having a hardening area 25 is explained below with reference to FIGS. 5A to 5C. Here, as shown in FIG. 5A, the hardening material 20 is introduced between the first metal foil 21 and the carrier 1. After that, the hardening material 20 is completely or at least partially diffused into the first metal foil 21 during a conditioning step, in which the first metal foil 21 and the hardening material 20 are heated to temperatures of at least 350° C. The hardening material 20 may in this case be a component part of an active solder, with which the first metal foil 21 is connected to the carrier 1 by active hard soldering.

Figure 5B:
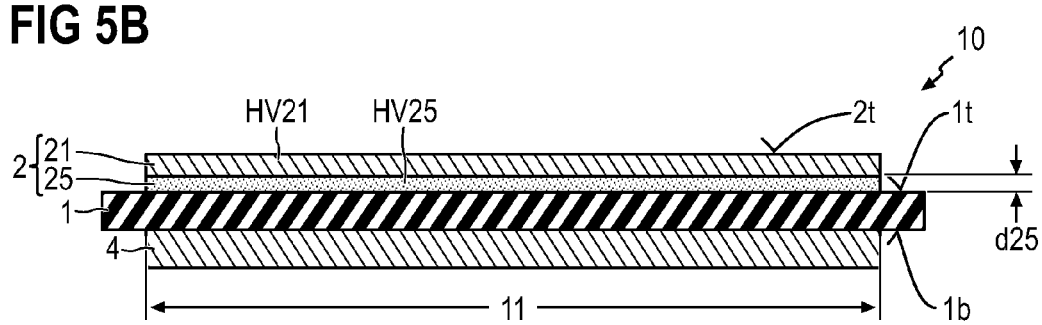

FIG. 5B shows the circuit carrier 10 after the production of the hardening area 25. The hardening material 20 has been made to match the material or the materials of the first metal foil 21 in such a way that the hardening area 25 has a hardness H25, which is higher than the original hardness H21 of the first metal foil 21. Optionally, the hardness H25 may be greater by at least 10% than the hardness H21.

A circuit carrier 10 as described with reference to FIGS. 5A and 5B may already be used for the mounting of one or more electronic components. Optionally, before it is populated (FIGS. 5B and 5C), the upper metallization layer 2 may be structured to form conductor tracks and/or mounting areas 51, 52, 53, 54, which is shown by way of example in FIG. 5C. The structuring may be performed in any way desired, for example by etching or milling or laser machining.

Figure 5C:
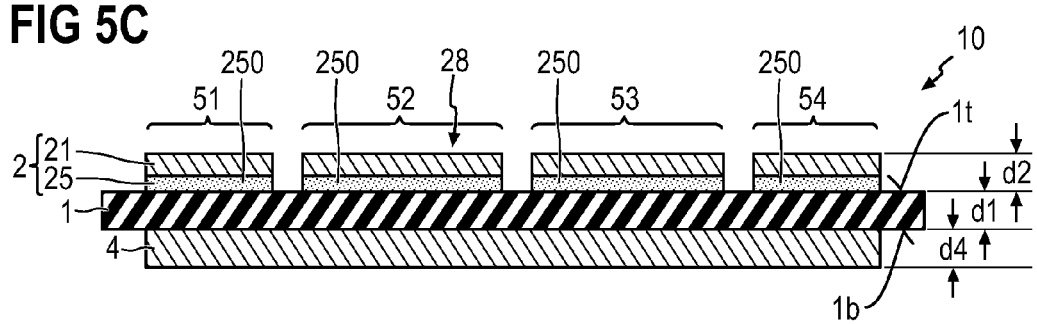
Figure 6:
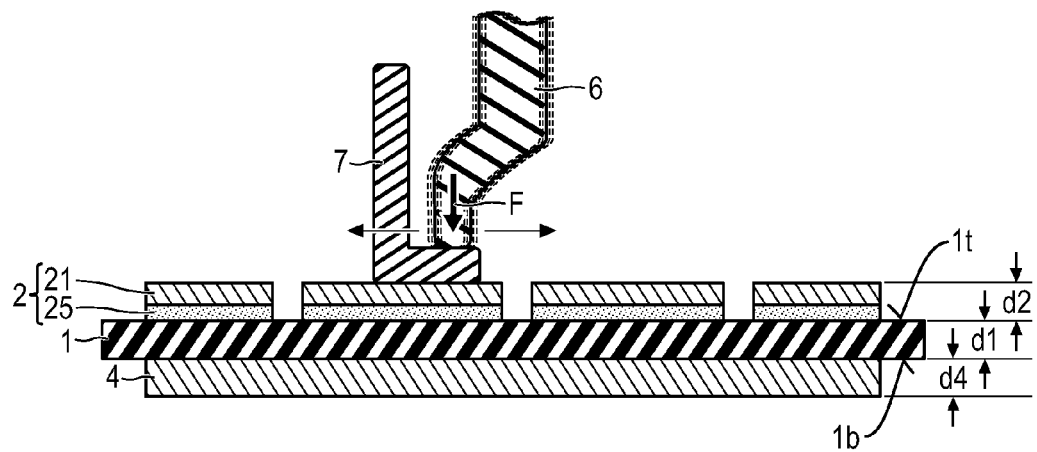
FIG. 6 shows the establishing of an electrically conducting connection between an electrical conductor and the upper metallization layer of the circuit carrier according to FIG. 5C by ultrasonic welding.

As represented in FIG. 6 by the example of the circuit carrier 10 according to FIG. 5C, an electrical conductor 7 may be welded onto the upper metallization layer 2, which has a hardening area 25, by ultrasonic welding. For this purpose, a connecting location 28 (FIG. 5C) is established on the side of the upper metallization layer 2 that is facing away from the carrier 1. The position of the connecting location 28 is in turn chosen such that—as in the case of all the variants of the invention—the hardening area 25 is arranged between the connecting location 28 and the carrier 1. The welding on of the conductor 7 at the connecting location 28 is performed in the way already explained with reference to FIG. 2.

As already explained on the basis of the previous exemplary embodiments, a hardening area 25 may have just one (mathematically) contiguous portion 250 (FIGS. 1B, 3B and 5B) or else in each case more than one (FIGS. 1C, 3C and 5C) contiguous portion 250. As can be seen from the exemplary embodiments according to FIGS. 1C, 3C and 5C, these may be produced by a previously created hardening area 25 having been divided into at least two respectively contiguous portions 250 by structuring of the upper metallization layer 2.

Figure 7A:
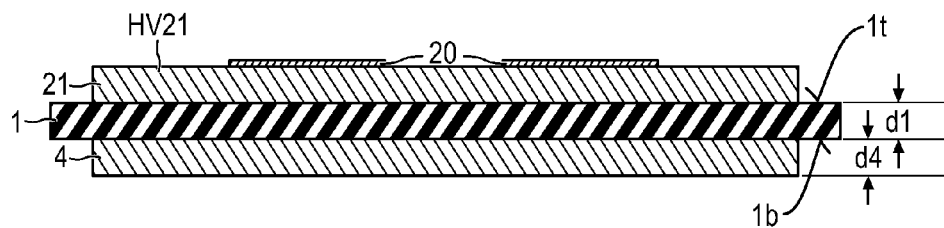
FIGS. 7A to 7B show various steps of a method for producing a circuit carrier of which the hardening area has at least two respectively contiguous portions that are spaced apart from one another.
Figure 7B:
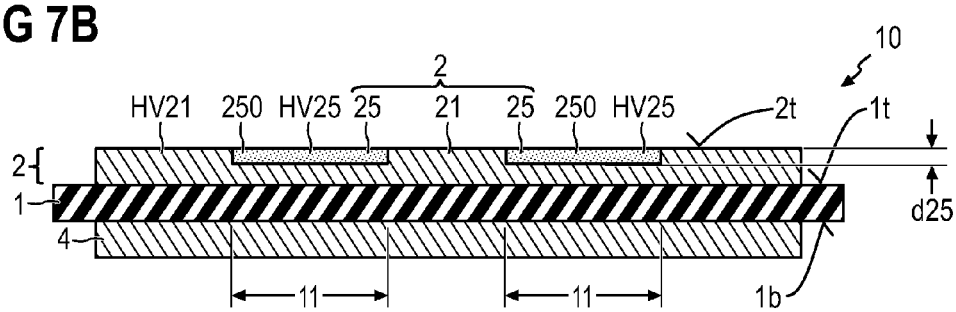

A further method for producing a circuit carrier of which the hardening area 25 has at least two respectively contiguous portions 250 that are spaced apart from one another is explained in FIGS. 7A and 7B. The method for producing the portions 250 (FIG. 7B) corresponds to the method explained on the basis of FIGS. 1A to 1B, with the difference that the hardening material 20 in at least two parts that are spaced apart from one another is applied to the side of the first metal foil 21 that is facing away from the carrier 1. As a result, a hardening area 25 with at least two respectively contiguous portions 250 that are spaced apart from one another is created by the conditioning step.

Figure 8A:
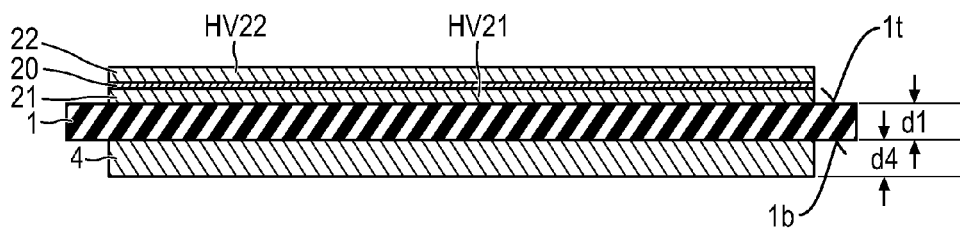
FIGS. 8A to 8B show various steps of a further method for producing a circuit carrier of which the hardening area has at least two respectively contiguous portions that are spaced apart from one another.
Figure 8B:
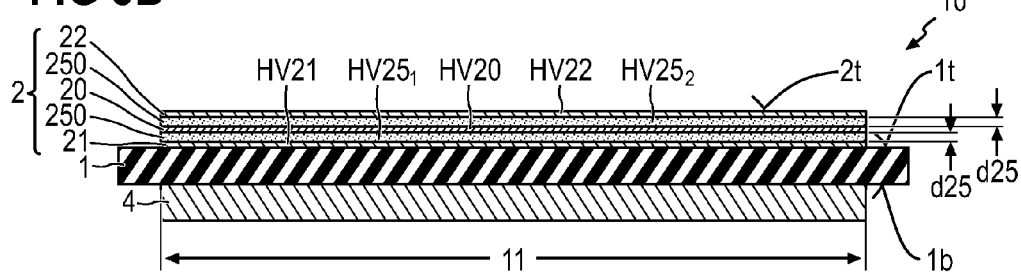

Yet another method for producing a circuit carrier of which the hardening area 25 has at least two respectively contiguous portions 250 that are spaced apart from one another is now explained with reference to FIGS. 8A and 8B. The method for producing the portions 250 (FIG. 8B) corresponds to the method explained on the basis of FIGS. 3A to 3B, with the difference that the hardening material 20 is not completely but only partially diffused into the first metal foil 21 and the second metal foil 22. After the conditioning step, two respectively contiguous portions 250 are obtained, which are spaced apart from one another and between which a residue of the hardening material 20 remains.

As explained above, a hardening area 25 of an upper metallization layer 2 has at least one contiguous portion 250. In this case, a hardening area 25 may have just one contiguous portion 250, or else at least two respectively contiguous portions 250. In principle, the number of contiguous portions 250 may, however, be chosen as desired.

Irrespective of the number of contiguous portions 250, they may have a thickness d25 of for example at least 5 μm and/or of at most 100 μm. In this case, the thickness d25 should be determined perpendicularly in relation to the upper side 1t of the carrier 1.

Figure 9:
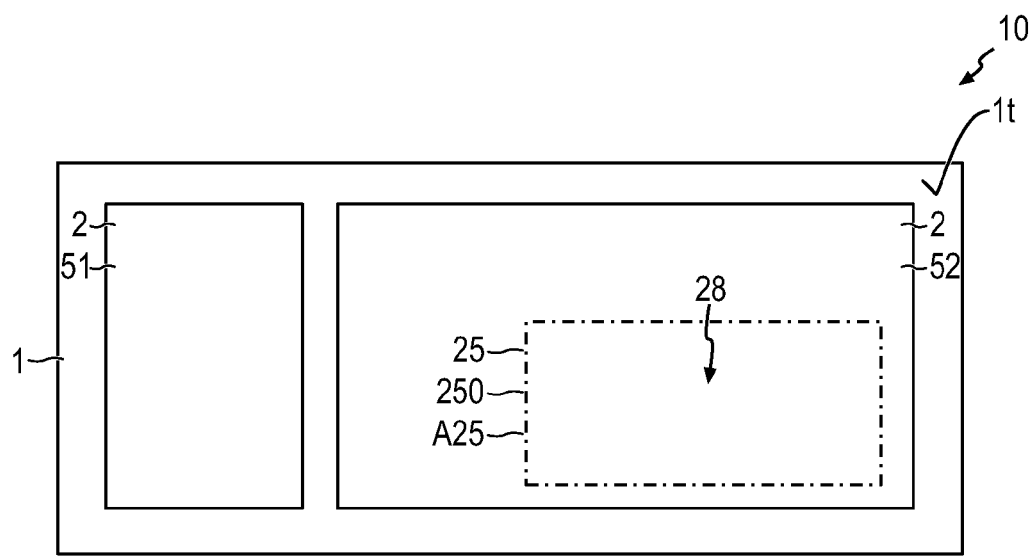
FIG. 9 shows a plan view of a circuit carrier with an upper metallization layer, which has a hardening area.

Alternatively or in addition, such a contiguous portion 250 may have a base area A250 of at least 1 mm² or at least 4 mm². FIG. 9 shows a plan view of a circuit carrier 10 of which the upper metallization layer 2 has a hardening area with a contiguous portion 250 with a base area A250. In the present plan view, the contiguous portion 250 may be concealed or visible, depending on the position that it adopts in the upper metallization layer 2. Its delimitation line is therefore represented by dashes. The base area A250 is in this case dictated by the size of the projection area of an orthogonal projection of the contiguous portion 250 onto a plane parallel to the upper side 1t.

There follows an explanation of some further aspects, which—unless mentioned otherwise—can be realized in the case of all the embodiments of the invention. These further aspects may—unless otherwise mentioned—be combined with one another in any way desired.

According to a first aspect, a contiguous portion 250 may have at every location a first hardness H21, which is greater than a second hardness H21 of the first metal foil 21.

According to a second aspect, the hardening area 25 may have at every location a first hardness H25, which is greater than a second hardness H21 of the first metal foil 21.

According to a third aspect, a contiguous portion 250 may have at every location a first reduced modulus of elasticity $E_r250$, which is greater than the second reduced modulus of elasticity $E_r21$ of the first metal foil 21.

According to a fourth aspect, the hardening area 25 may have at every location a first reduced modulus of elasticity $E_r25$, which is greater than a second reduced modulus of elasticity $E_r21$ of the first metal foil 21.

According to a fifth aspect, the carrier 1 provided may be formed as a ceramic layer, or as a green sheet, which is sintered to form a ceramic during the production method of the circuit carrier 10. If the carrier 1 provided is formed as a green sheet, it is sintered before the side of the upper metallization layer 2 that is facing away from the carrier 1 is populated with an electronic component and before an electrical conductor 7 is connected to the side of the upper metallization layer 2 that is facing away from the carrier 1 by ultrasonic welding.

According to a sixth aspect, the upper metallization layer 2 may have a thickness d2 of at least 0.2 mm.

According to a seventh aspect, the upper metallization layer 2 may have a thickness d2 of at most 2 mm.

According to an eighth aspect, the electrically insulating carrier 1 provided may be formed as a ceramic layer, which is connected in a material-bonding manner to the first metal foil 21 before and/or during and/or after the production of the hardening area 25.

According to a ninth aspect as an alternative to the eighth aspect, the electrically insulating carrier 1 provided may be formed as a green sheet, which is connected in a material-bonding manner to the first metal foil 21 before and/or during and/or after the production of the hardening area 25.

According to a tenth aspect, an electrical conductor 7, which is welded to the side of the upper metallization layer 2 that is facing away from the carrier 1 at a predetermined connecting location 28 by ultrasonic welding, may have a conductor cross section of at least 0.1 mm² or at least 0.25 mm².

According to an eleventh aspect, a first metal foil 21 may consist of one of the following metals or comprise an alloy with at least one of the following metals: copper; aluminum.

According to a twelfth aspect, a second metal foil 22 may consist of one of the following metals or comprise an alloy with at least one of the following metals: copper; aluminum.

According to a thirteenth aspect, a lower metallization layer 4 may consist of one of the following metals or comprise an alloy with at least one of the following metals: copper; aluminum.

According to a fourteenth aspect, the hardening material 20 may contain one or more of the following substances or consist thereof: aluminum (Al), beryllium (Be), chromium (Cr), iron (Fe), copper (Cu), magnesium (Mg), manganese (Mn), nickel (Ni), phosphorus (P), silver (Ag), silicon (Si), tin (Sn), zinc (Zn), zirconium (Zr), the hardening material having to comprise at least one substance with which a hardening of the respective metal foil to be hardened can be achieved.

The invention claimed is:

1. A method for producing a circuit carrier, comprising the steps of:
   providing an electrically insulating carrier, which has an upper side and also an underside opposite from the upper side;
   providing a first metal foil above the upper side;
   providing a second metal foil above the first metal foil;
   providing a hardening material between the first metal foil and the second metal foil, the hardening material being completely covered by the second metal foil; and
   producing an upper metallization layer arranged on the upper side and having a hardening area, at least one contiguous portion of the hardening area being created by at least part of the hardening material being diffused into the first metal foil and at least part of the hardening material being diffused into the second metal foil, wherein the hardening material is diffused into the first and second metal foils by heating the first metal foil and the hardening material to temperatures of at least 350° C.

2. The method as claimed in claim 1, in which the contiguous portion has a thickness of between 5 μm and 100 μm.

3. The method as claimed in claim 1, in which the contiguous portion has a base area of at least 1 mm².

4. The method as claimed in claim 1, in which the contiguous portion has at every location:
- a first hardness, which is greater than a second hardness of the first metal foil.

5. The method as claimed in claim 1, in which the carrier provided is formed as a ceramic layer or as a green sheet.

6. The method as claimed in claim 1, in which, before or after the application of the hardening material, the first metal foil is connected in a material-bonding manner to the carrier.

7. The method as claimed in claim 1, in which the thickness of the upper metallization layer is at most 2 mm.

8. The method as claimed in claim 1, in which
- the electrically insulating carrier provided is formed as a ceramic layer, which is connected in a material-bonding manner to the first metal foil before and/or during and/or after the production of the hardening area; or
- the electrically insulating carrier provided is formed as a green sheet, which is connected in a material-bonding manner to the first metal foil before and/or during and/or after the production of the hardening area.

9. The method as claimed in claim 1, in which the upper metallization layer is structured after the production of the hardening area.

10. The method as claimed in claim 1, in which no electrical component has been connected to the side of the upper metallization layer that is facing away from the carrier by a soldered or sintered connection.

11. The method as claimed in claim 1, wherein the hardening material is completely diffused into the first metal foil.

12. A method for producing a circuit carrier, comprising the steps of:
- providing an electrically insulating carrier, which has an upper side and also an underside opposite from the upper side;
- providing a first metal foil having an upper surface that faces away from the electrically insulating carrier;
- providing a hardening material on a portion of the upper surface of the first metal foil; and
- diffusing the hardening material into the upper surface of the first metal foil thereby forming a hardening area,
- wherein at least one contiguous portion of the hardening area is contained within the first metal foil, extends to the upper surface of the first metal foil, and adjoins non-diffused portions of the first metal foil at outer sides of the at least one contiguous portion that extend to the upper surface of the first metal foil.

* * * * *